United States Patent
Yang

Patent Number: 6,011,818
Date of Patent: Jan. 4, 2000

[54] AUTOMATIC FREQUENCY CONTROL METHOD

[75] Inventor: Jae Mo Yang, Suwon, Rep. of Korea

[73] Assignee: Samsung Electronics Co., Ltd., Kyungki-Do, Rep. of Korea

[21] Appl. No.: 08/998,608

[22] Filed: Dec. 29, 1997

[30] Foreign Application Priority Data

Dec. 30, 1996 [KR] Rep. of Korea ............ 96-78037

[51] Int. Cl.$^7$ ............................................. H04L 27/06
[52] U.S. Cl. ...................... 375/344; 375/327; 375/376; 455/192.2; 455/260; 455/264
[58] Field of Search ............................. 375/327, 344, 375/376; 455/192.1, 192.2, 260, 264

[56] References Cited

U.S. PATENT DOCUMENTS

| | | | |
|---|---|---|---|
| 3,882,412 | 5/1975 | Apple, Jr. | 331/1 A |
| 4,151,485 | 4/1979 | LaFratta | 331/1 A |
| 4,271,533 | 6/1981 | Hand et al. | 455/192.2 |
| 4,712,077 | 12/1987 | Ansell et al. | 331/25 |
| 4,903,329 | 2/1990 | Marik et al. | 455/182.1 |
| 5,022,058 | 6/1991 | Yoshida et al. | 375/376 |
| 5,287,182 | 2/1994 | Haskell et al. | 348/500 |
| 5,335,348 | 8/1994 | Kono | 455/192.2 |
| 5,724,105 | 3/1998 | Hatano | 348/725 |

*Primary Examiner*—Stephen Chin
*Assistant Examiner*—Lenny Jiang
*Attorney, Agent, or Firm*—Sughrue, Mion, Zinn Macpeak & Seas, PLLC

[57] ABSTRACT

The present invention relates to a frequency control apparatus for a television and a video cassette tape recorder, and more particularly to an automatic frequency control method wherein a frequency value of a voltage controlled oscillator is increased or decreased and stored by determining whether an oscillator is in a range capable of operating a phase locked loop when an oscillation frequency of the voltage controlled oscillator of the phase locked loop is not synchronized with the intermediate frequency when a frequency is automatically controlled by comparing phases and frequencies of the phase locked loop and the intermediate frequency.

6 Claims, 5 Drawing Sheets

AUTOMATIC FREQUENCY CONTROL METHOD

BACKGROUND OF THE INVENTION

1. Field of the Invention

The present invention relates to an automatic frequency control method wherein a frequency value of a voltage controlled oscillator is increased or decreased and stored by determining whether an oscillation control voltage of the voltage controlled oscillator is in a range capable of operating a phase locked loop when an oscillation frequency of the voltage controlled oscillator of the phase locked loop is not synchronous with the intermediate frequency when a frequency is automatically controlled by comparing phases and frequencies of the phase locked loop and the intermediate frequency.

2. Prior Art

In general, when a television and a video cassette tape recorder, which process image and sound signals, selects a channel, a control section, such as a microcomputer, compares the intermediate frequency IF with an oscillation frequency of a voltage controlled oscillator of a phase locked loop PLL for an automatic frequency control, and controls reception of a desired channel. As shown in FIG. 4, an automatic frequency control apparatus comprises a reception section 10 for receiving a radio frequency signal (RF signal) input through an antenna, detecting a level of the RF signal and controlling the RF signal to become an exact signal frequency; an intermediate frequency amplification section 11 for amplifying an output signal of the reception section 10 up to desired voltage level; a demodulation section 12 for outputting an image signal and a sound signal from an output signal of the intermediate frequency amplification section 11; a phase locked loop 13 for maintaining a certain frequency; and comparing the intermediate frequency with the oscillation frequency of the voltage controlled oscillator and a control section 14 for increasing and decreasing a frequency value of the voltage controlled oscillator based on the comparison result.

In the automatic frequency control having a construction as shown in FIG. 4, the reception section 10 receives a RF signal input from an antenna. The received RF signal is input to the intermediate frequency amplification section 11 which outputs a desired signal component by controlling the RF signal to become an exact signal frequency according to a frequency value of the voltage controlled oscillator which is fed from the control section 14. A signal input to the intermediate frequency amplification section 11 is amplified by a desired voltage level for an output.

Further, the phase locked loop 13 compares the intermediate frequency with a phase and a frequency of an oscillation signal of the voltage controlled oscillator and outputs a comparison result to the control section 14. The control section 14 increases or decreases a frequency value of the voltage controlled oscillator according to a value output from the phase locked loop 13. The increased or decreased frequency value is fed to the reception section 10 as an exactly controlled frequency. Such an exactly controlled frequency is input to the demodulation section 12 through the intermediate frequency amplification section 11 to output an image signal and a sound signal.

FIG. 2 is a flowchart that shows a conventional automatic frequency control method in an automatic frequency control apparatus. As shown in FIG. 2, first a factory mode is set (S10), then a voltage controlled oscillator adjustment mode is selected (S11). Thereafter, the value of the uppermost bit AFA of an inner interface control bus which is transmitted from the phase locked loop 13 to the control section 14 is checked (S12). The value of the uppermost bit AFA becomes "0" when there is a long difference between the intermediate frequency and the frequency of the voltage controlled oscillator of the phase locked loop 13. The value of the uppermost bit AFA becomes "1" when the difference between the intermediate frequency and the frequency of the oscillation signal is less than a predetermined value.

In step S12, when the value of the uppermost bit AFA becomes "0", the value of the lowermost bit AFB of the inner interface control bus, which is transmitted from the phase locked loop 13 to the control section 14, is checked (S13). In step S12, when the value of the lowermost bit AFB is "0", a frequency value of the voltage controlled oscillator is increased to synchronize the intermediate frequency with an oscillation frequency of the phase locked loop 13(S14). When the value of the lowermost bit AFB is "1", the frequency value of the voltage controlled oscillator is decreased (S15). Thereafter, the procedure returns to step S12 and this step is repeated until the difference becomes less than a predetermined value.

In step S12, when the uppermost bit AFA is "1", the lowermost bit AFB of the inner interface control bus is checked(S16). If the lowermost bit is "0", the frequency value of the voltage controlled oscillator is increased (S17). If the lowermost bit is "1", the frequency value of the voltage controlled oscillator is decreased(S18).

Further, a determination is made as to whether the value of the lowermost bit AFB is changed from "0" to "1" or vice versa (S19). When the value is changed, variation of the voltage controlled oscillator stops and the frequency value of the voltage controlled oscillator is stored because the oscillation signal of the phase locked loop 13 is synchronized with the intermediate frequency(S20). When the value is not changed, a value of a counter N is increased(S21) and it is determined whether the value of the counter N is larger than a predetermined value(S22). In the above step S22, if the value of the counter N is larger than the predetermined value, an error message is displayed (S23) and the procedure ends. If the value of the counter N is not larger than the predetermined value, the procedure returns to step S16 and the subsequent steps are repeated.

Such a conventional automatic frequency control method compares the intermediate frequency with the oscillation frequency of the voltage controlled oscillator of the phase locked loop and controls a frequency by means of status changes of the uppermost bit and the lowermost bit according to the difference between the two frequencies. Therefore, the conventional automatic frequency control method has a drawback in that a frequency is not controlled under certain circumstances.

SUMMARY OF THE INVENTION

According, it is an object of the present invention to provide an automatic frequency control method wherein a frequency control apparatus compares the intermediate frequency with an oscillation frequency of a voltage controlled oscillator of a phase locked loop for an automatic frequency control and checks an oscillation control voltage of the voltage controlled oscillator again in case frequency control is not accomplished.

In order to attain the above object, first, the oscillation frequency of the voltage controlled oscillator of the phase locked loop is compared with the intermediate frequency and a frequency value of the voltage controlled oscillator is changed according to the frequency difference. If the frequency value of the voltage controlled oscillator is not changed, an automatic frequency control checking step is performed to determine if the oscillation control voltage of the voltage controlled oscillator is in a range capable of operating the phase locked loop.

DETAILED DESCRIPTION OF THE PREFERRED EMBODIMENT

Hereinafter, an automatic frequency control method according to an embodiment of the present invention will be described in detail with reference to the accompanying drawings.

Figure 1:
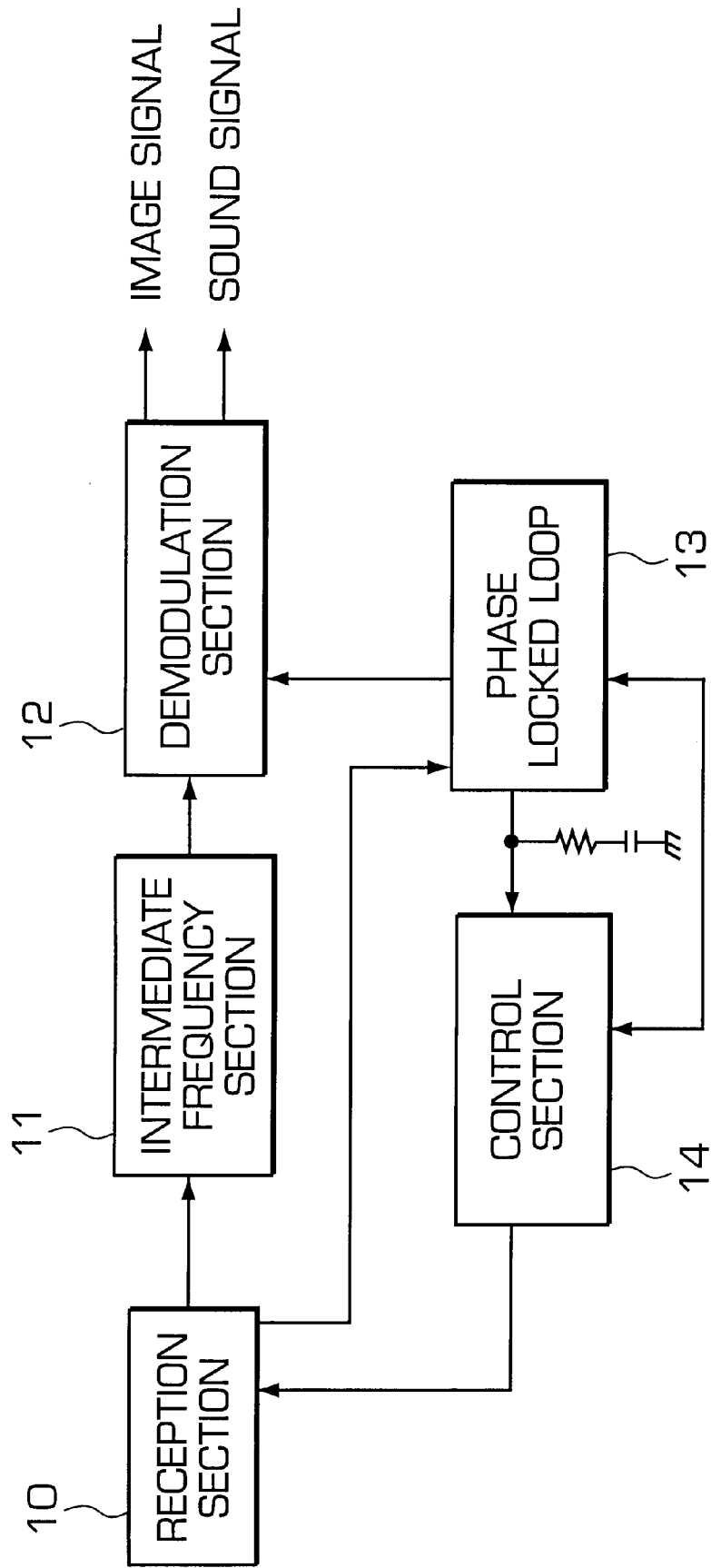
FIG. 1 is a schematic block diagram showing an automatic frequency control apparatus to employ an embodiment of the present invention.
Figure 2:
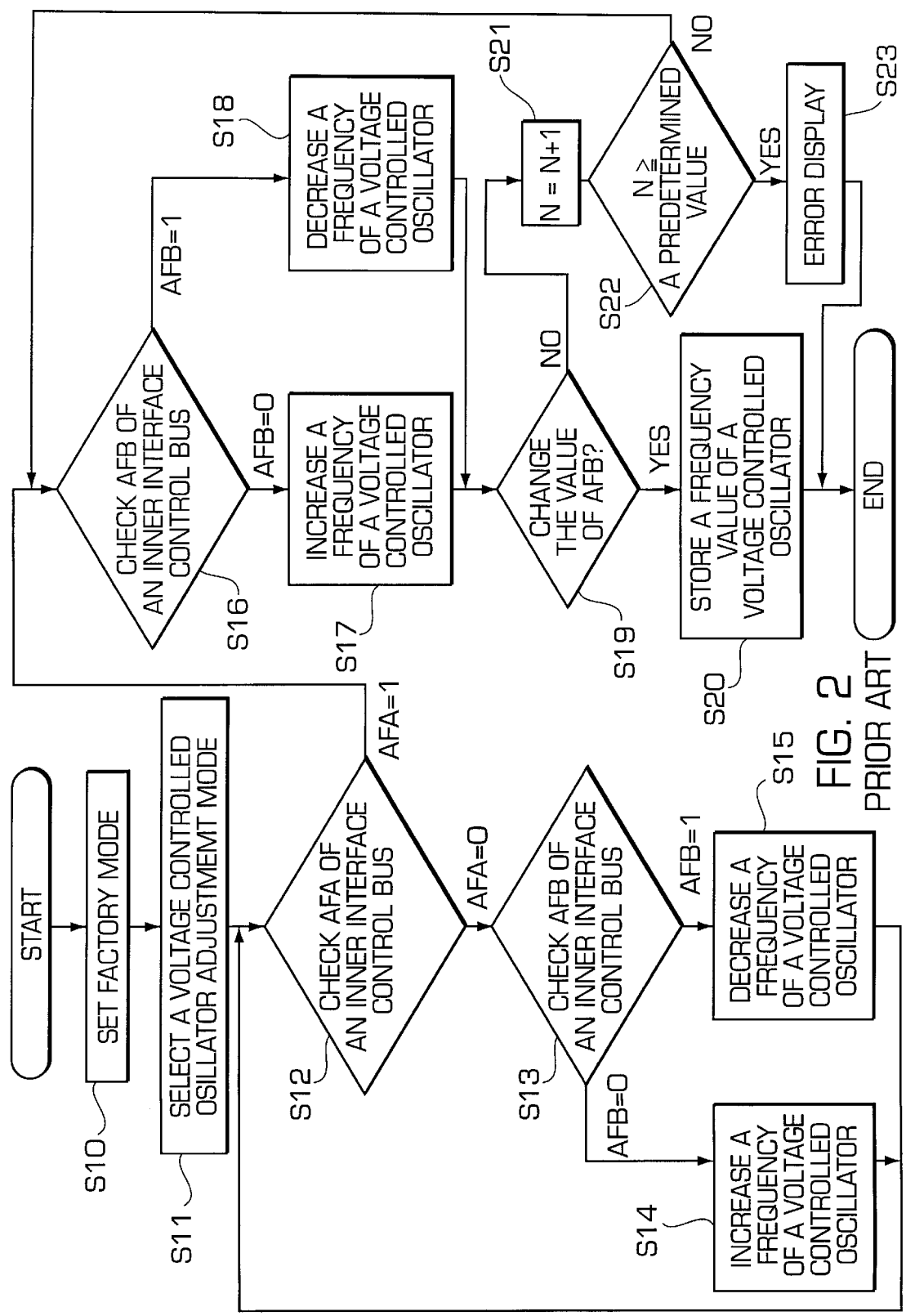
FIG. 2 is a flow chart showing an automatic frequency control method of a conventional automatic frequency control apparatus.
Figure 3A:
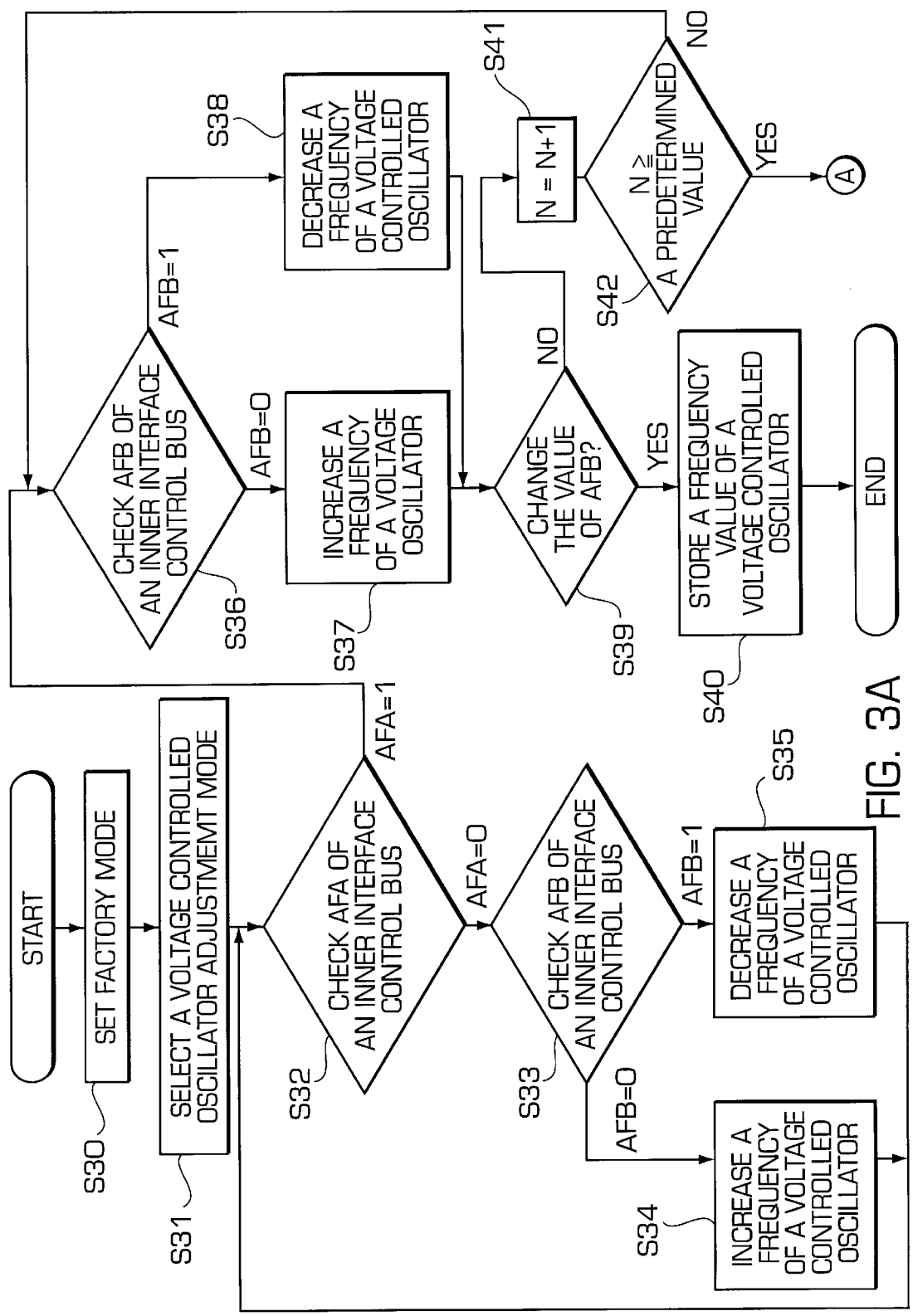
FIGS. 3A and 3B are flow charts showing an automatic frequency control method according to an embodiment of the present invention.
Figure 3B:
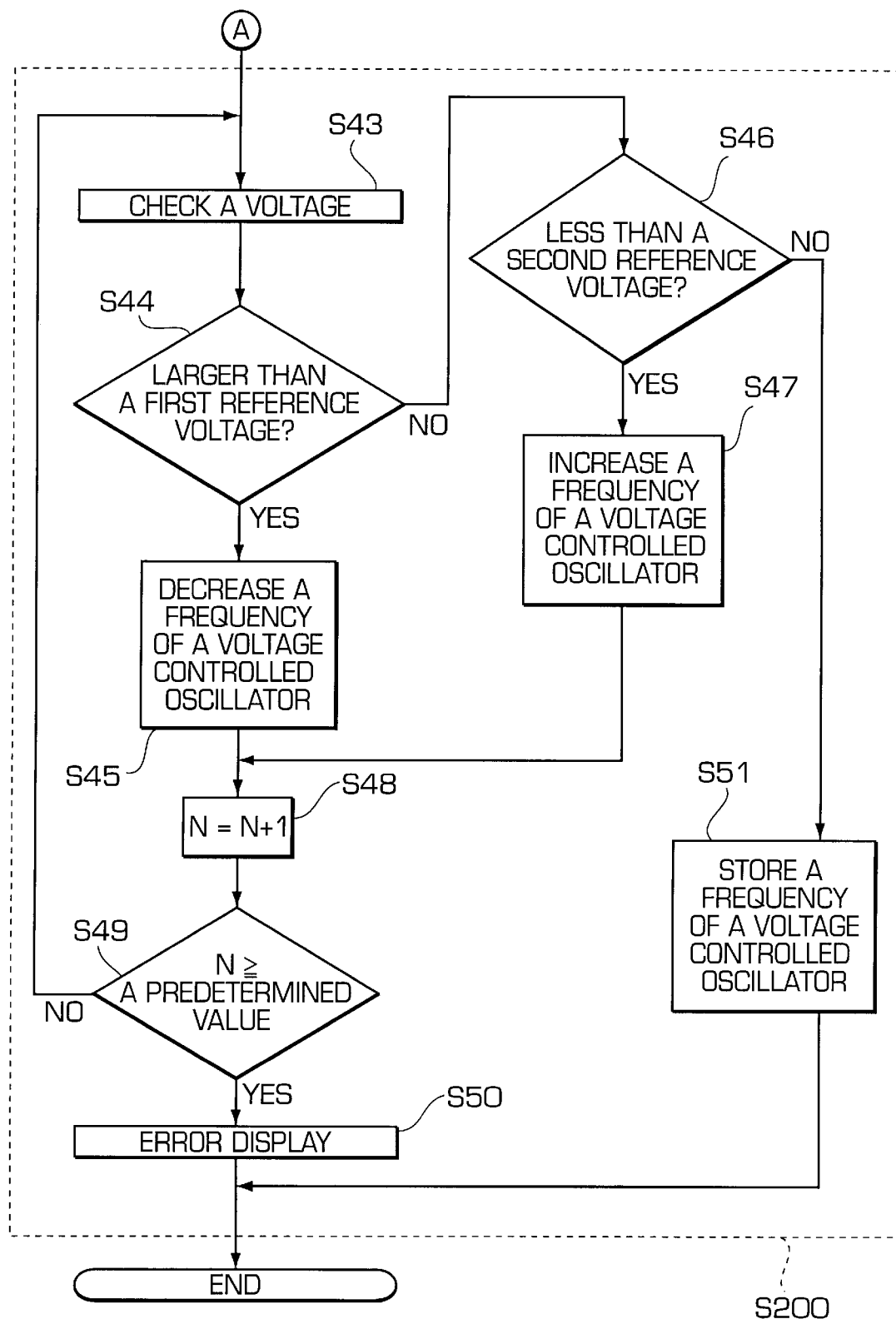
Figure 4:
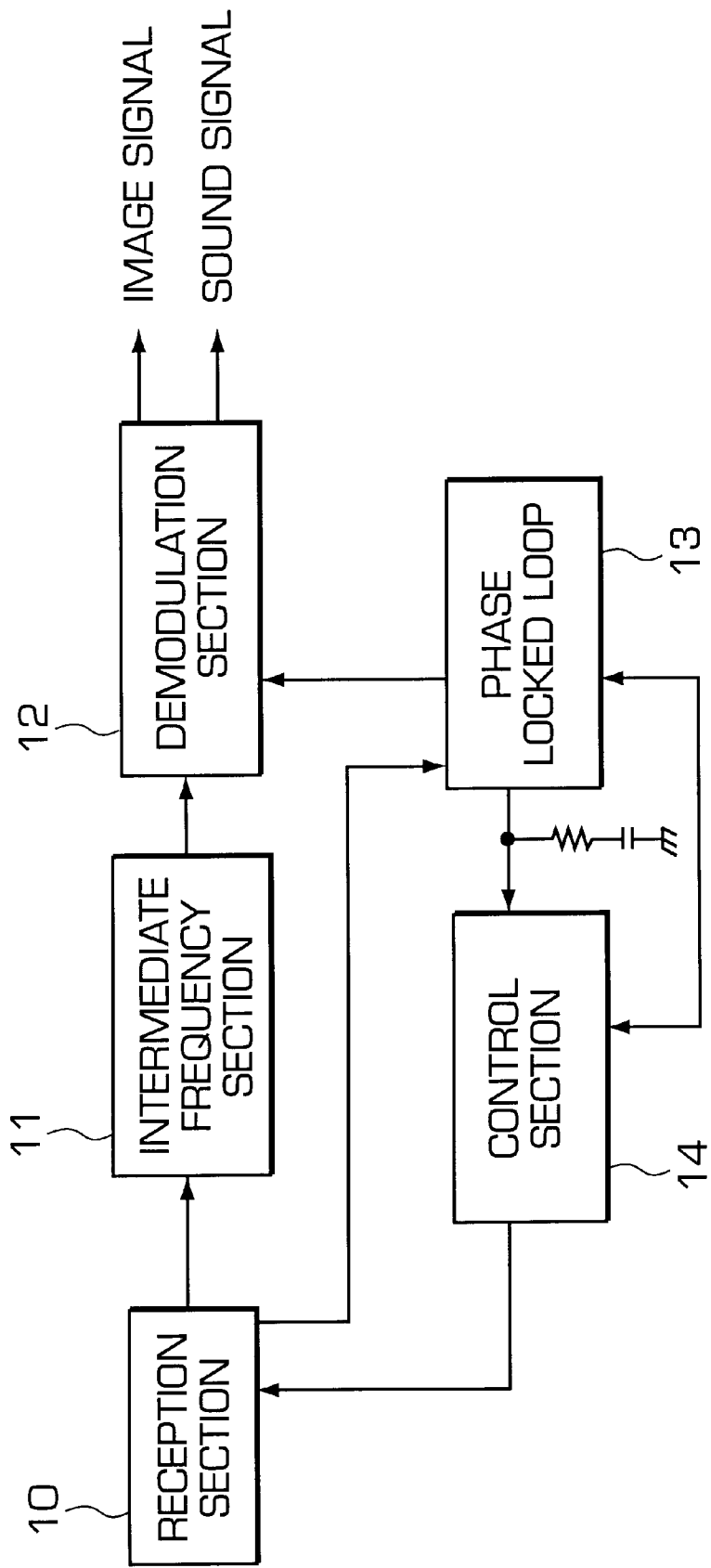
FIG. 4 is a schematic block diagram showing a conventional automatic frequency control apparatus.

FIGS. 3A and 3B are flow charts showing an automatic frequency control method according to an embodiment of the present invention. As shown in FIGS. 3A and 3B, the automatic frequency control method comprises a first process S100 and a second process S200. In the first process S100, an oscillation frequency of a voltage controlled oscillator of a phase locked loop 13 is compared with the intermediate frequency. The upper most bit AFA and the lowermost bit AFB of an inner interface control bus, which transmits the comparison result to the control section 14', are checked. Based on this result, a frequency value of the voltage controlled oscillator is increased or decreased. When the oscillation frequency of the voltage controlled oscillator is synchronized with the intermediate frequency, the frequency value is stored.

In the second process S200, when the frequency of the voltage controlled oscillator is not tuned with the intermediate frequency in the above first process S100, it is determined whether an oscillation control voltage of the voltage controlled oscillator is in a range capable of operating the phase locked loop 13. Based on this determination, the frequency value of the voltage controlled oscillator is increased or decreased. When the voltage of the voltage controlled oscillator is in a range capable of operating the phase locked loop 13, the frequency value is stored.

In describing the above steps in detail, first a factory mode is set (S30), and then a voltage controlled oscillator adjustment mode is selected(S31). Thereafter, a frequency of the voltage controlled oscillator of the phase locked loop 13 is compared with the intermediate frequency, and the value of the uppermost bit AFA of an inner interface control bus, which transmits the comparison result to the control section 14', is checked (S32). The value of the uppermost bit AFA becomes '0' when there is a large difference between the intermediate frequency and the frequency of the voltage controlled oscillator of the phase locked loop 13. The value of the uppermost bit AFA becomes "1" when the difference between the intermediate frequency and the frequency of the oscillation signal is less than a predetermined value.

In step S32, when the value of the uppermost bit AFA becomes "0", the value of the lowermost bit AFB of the inner interface control bus, which is transmitted from the phase locked loop 13 to the control section 14', is checked (S33). In step S33, when the value of the lowermost bit AFB is "0", a frequency value of the voltage controlled oscillator is increased to synchronized the intermediate frequency with an oscillation frequency of the phase locked loop 13(S34). When the value of the lowermost bit AFB is "1", the frequency value of the voltage controlled oscillator is decreased (S35). Thereafter, the procedure returns to step S32 and this step is repeated until the difference becomes less than a predetermined value.

In step S32, when the uppermost bit AFA is "1", the lowermost bit AFB of the inner interface control bus is checked(S36). If the lowermost bit is "0", the frequency value of the voltage controlled oscillator is increased(S37). If the lowermost bit is "1", the frequency value of the voltage controlled oscillator is decreased(S38).

Further, a determination is made as to whether the value of the lowermost bit AFB is changed from "0" to "1" or vice versa (S39). When the value is changed, variation of the voltage controlled oscillator stops and the frequency value of the voltage controlled oscillator is stored because the oscillation signal of the phase locked loop 13 is synchronized with the intermediate frequency(S40). When the value is not changed, a value of a counter N is increased(S41) and a determination is made as to whether the value of the counter N is larger than a predetermined value(S42), wherein the predetermined value is a value which is set to determine the repetition times of the step of increasing or decreasing the frequency of the voltage controlled oscillator.

In the above step S42, If the value of the counter N is not larger than the predetermined value, the procedure returns to step (S36) and the subsequent steps are repeated. If the value of the counter N is larger than the predetermined value, a determination is made as to whether the oscillation control voltage of the voltage controlled oscillator is in a range capable of operating the phase locked loop 13 (S43).

In step S43, a determination is made as to whether the oscillation control voltage of the voltage of the voltage controlled oscillator is larger than a first predetermined reference voltage, for example 2.7V (S44). If the oscillation control voltage is larger than the first reference voltage, the frequency value of the voltage controlled oscillator is decreased(S45). If the oscillation control voltage is not larger than the first reference voltage, a determination is made as to whether the oscillation control voltage is smaller than a second predetermined reference voltage, for example 2.3V (S46). In step S46, when the oscillation control voltage of the voltage controlled oscillator is smaller than the second reference voltage, the frequency value of the voltage controlled oscillator is increased(S47) and then the value of the counter N is increased by one (S48).

Thereafter, a determination is made as to whether the value of the counter N is larger than a predetermined value(S49). If the value of the counter N is less than the predetermined value, the procedure returns to step S43 and the subsequent steps are repeated. If the value of the counter N is larger than the predetermined value, an error message is displayed(S50) and the procedure ends.

In step S46, if the oscillation control voltage of the voltage controlled oscillator is not less than the second reference voltage, the present value of the voltage controlled oscillator is stored (S51) because the oscillation control voltage is a voltage in a range between the first reference voltage and the second reference voltage to enable the phase locked loop to operate. Accordingly, a series of steps are ended for an automatic frequency control.

As described above, with the automatic frequency control method according to the present invention, automatic frequency control can be much more surely attained because a frequency control apparatus compares the intermediate frequency with an oscillation frequency of a voltage controlled oscillator of a phase locked loop for an automatic frequency control and checks an oscillation control voltage of the voltage controlled oscillator again when frequency control is not attained.

What is claimed is:

1. An automatic frequency control method, comprising:

a first process for comparing an oscillation frequency of a voltage controlled oscillator of a phase locked loop with an intermediate frequency, checking an uppermost bit and a lowermost bit of an inner interface control bus, which transmits the comparison result to a control section, increasing and decreasing a frequency value of the voltage controlled oscillator according to the bit check result, and storing the frequency value when the oscillation frequency of the voltage controlled oscillator is synchronized with the intermediate frequency; and a second process for checking whether an oscillation control voltage is in a range for operating the phase locked loop when the frequency of the voltage controlled oscillator is not tuned with the intermediate frequency in the first process, increasing or decreasing the frequency value of the voltage controlled oscillator according to the voltage checking result, and storing the frequency value when the voltage of the voltage controlled oscillator is in a range for operating the phase locked loop; wherein the said second process includes:

a first step for checking the oscillation control voltage of the voltage controlled oscillator;

a second step for decreasing the value of the voltage controlled oscillator when the oscillation control voltage of the voltage controlled oscillator in the first step is larger than a first reference voltage, increasing the value of the voltage controlled oscillator when the oscillation control voltage of the voltage controlled oscillator in the first step is less than a second reference voltage, which is lower than the first reference voltage, incrementing a counter value and determining whether the counter value is larger than a predetermined value.

2. The automatic frequency control method as claimed in claim 1, wherein the first process includes a first step for checking the uppermost bit of the inner interface control bus;

a second step for checking the lowermost bit when the uppermost bit is "0" in the first step, increasing the value of the voltage controlled oscillator when the lowermost bit is "0", and decreasing the value of the voltage controlled oscillator when the lowermost bit is "1";

a third step for checking the lowermost bit when the uppermost bit is "1" in the first step, increasing the value of the voltage controlled oscillator when the lowermost bit is "0", and decreasing the value of the voltage controlled oscillator when the lowermost bit is "1";

a fourth step for checking whether the lowermost bit is changed after performing the third step; and a fifth step for storing the present value of the voltage controlled oscillator when a value of the lowermost bit is changed, increasing a second counter value when the value of the lowermost bit is not changed, and returning to the third step when the value of the second counter value is less than a predetermined value.

3. The automatic frequency control method as claimed in claim 1 or 2, wherein the value of the uppermost bit of the inner interface control bus is "0" when the difference between the oscillation frequency of the phase locked loop and the intermediate frequency is large, and the value of the uppermost bit of the inner interface control bus is "1" when the difference between the oscillation frequency of the phase locked loop and the intermediate frequency is less than a predetermined value.

4. The automatic frequency control method as claimed in claim 2, wherein, in the fourth step, the oscillation frequency of the voltage controlled oscillator is synchronized with the intermediate frequency when the lowermost bit is changed from "0" to "1" or vice versa.

5. The automatic frequency control method as claimed in claim 1, wherein the second process includes a third step for displaying an error if the counter value in the second step is larger than the predetermined value, and returning to the first step if the counter value is less than a predetermined value; and a fourth step for storing the frequency value of the voltage controlled oscillator if the oscillation control voltage of the voltage controlled oscillator in the first step is a value between the first reference voltage and the second reference voltage.

6. The automatic frequency control method as claimed in claim 5, wherein the first reference voltage is a maximum voltage of the oscillation control voltage of the voltage controlled oscillator for the phase locked loop to operate, and the second reference voltage is a minimum voltage of the oscillation control voltage of the voltage controlled oscillator for the phase locked loop to operate.

* * * * *